(12) United States Patent
Li et al.

(10) Patent No.: US 8,493,719 B2
(45) Date of Patent: Jul. 23, 2013

(54) ELECTRONIC DEVICE ENCLOSURE

(75) Inventors: Nai-Juan Li, Shenzhen (CN); Zhi-Ping Wu, Shenzhen (CN); Xu-Dong Nan, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 215 days.

(21) Appl. No.: 13/106,876

(22) Filed: May 13, 2011

(65) Prior Publication Data

US 2012/0098398 A1    Apr. 26, 2012

(30) Foreign Application Priority Data

Oct. 22, 2010  (CN) .......................... 2010 1 0516277

(51) Int. Cl.
*H05K 5/00*    (2006.01)
(52) U.S. Cl.
USPC ... 361/679.02; 361/752; 361/753; 361/679.6; 361/759; 361/801

(58) Field of Classification Search
USPC ................... 361/679.02, 801, 752, 753, 759, 361/679.6
See application file for complete search history.

(56) References Cited

U.S. PATENT DOCUMENTS

| | | | |
|---|---|---|---|
| 7,635,811 B2 * | 12/2009 | Chen et al. | 174/50 |
| 7,969,717 B1 * | 6/2011 | Shih et al. | 361/679.02 |
| 8,000,089 B2 * | 8/2011 | Chang | 361/679.02 |
| 8,228,669 B2 * | 7/2012 | Hu et al. | 361/679.2 |
| 8,248,817 B2 * | 8/2012 | Yeh et al. | 361/801 |

\* cited by examiner

*Primary Examiner* — Nguyen T Ha
(74) *Attorney, Agent, or Firm* — Altis Law Group, Inc.

(57) ABSTRACT

An electronic device enclosure includes a convex bottom plate, a first side plate connected to a first side of the convex bottom plate, and a second side plate connected to a second side of the convex bottom plate. An electronic component is attached to the convex bottom plate. A horizontal plane is defined by connecting bottom edges of the first side plate and the second side plate, and a distance is defined between a highest point of the convex bottom plate and the horizontal plane. The distance is in a range of about 0.7 mm to about 1.4 mm.

14 Claims, 5 Drawing Sheets

ELECTRONIC DEVICE ENCLOSURE

BACKGROUND

1. Technical Field

The present disclosure relates to an electronic device enclosure.

2. Description of Related Art

A bottom plate of an electronic device enclosure is often deformed when securing a plurality of electronic components. Many times, the bottom plate is so badly deformed that it becomes unusable.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
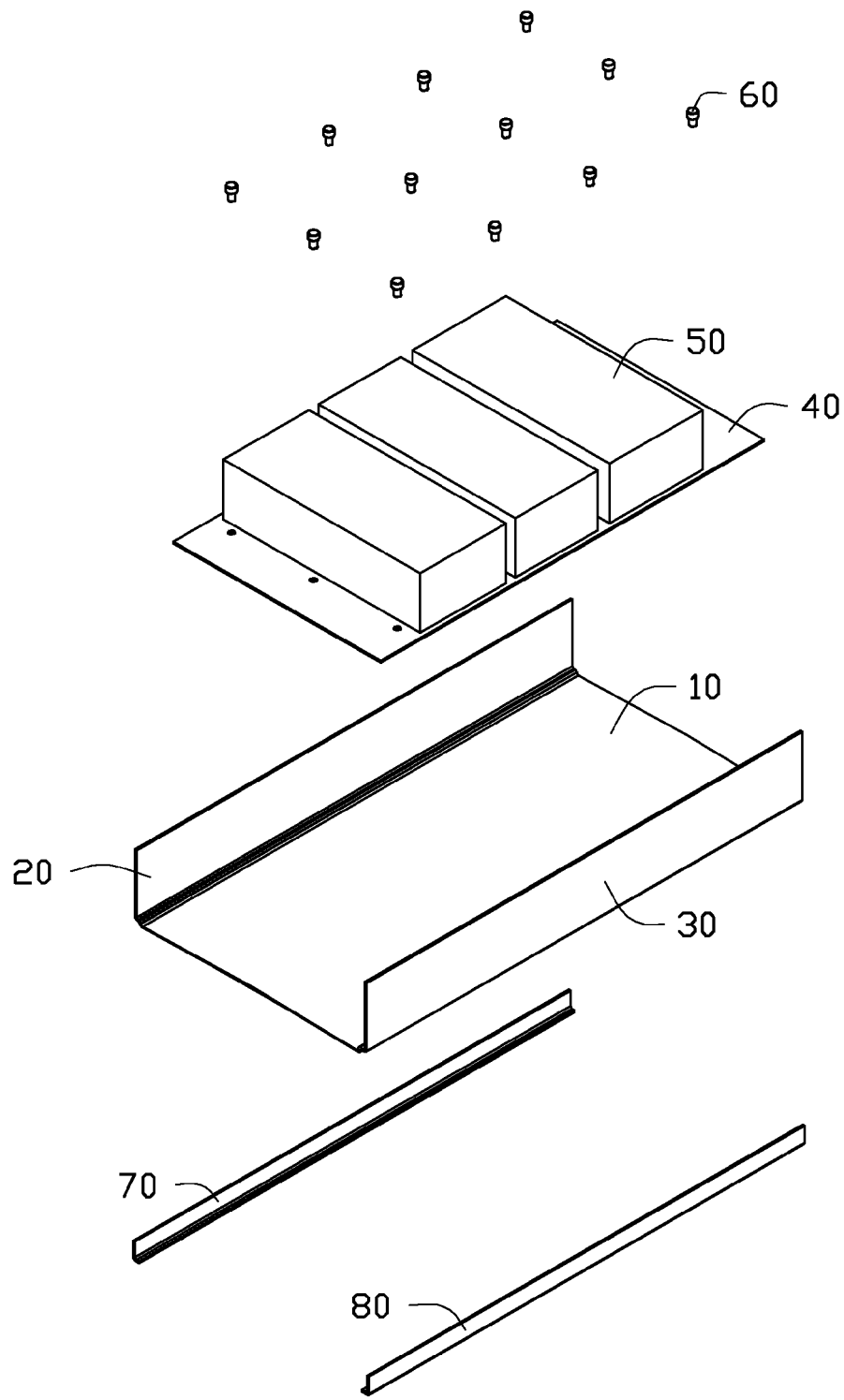
FIG. 1 is an exploded, isometric view of an electronic device enclosure in accordance with an embodiment.
Figure 2:
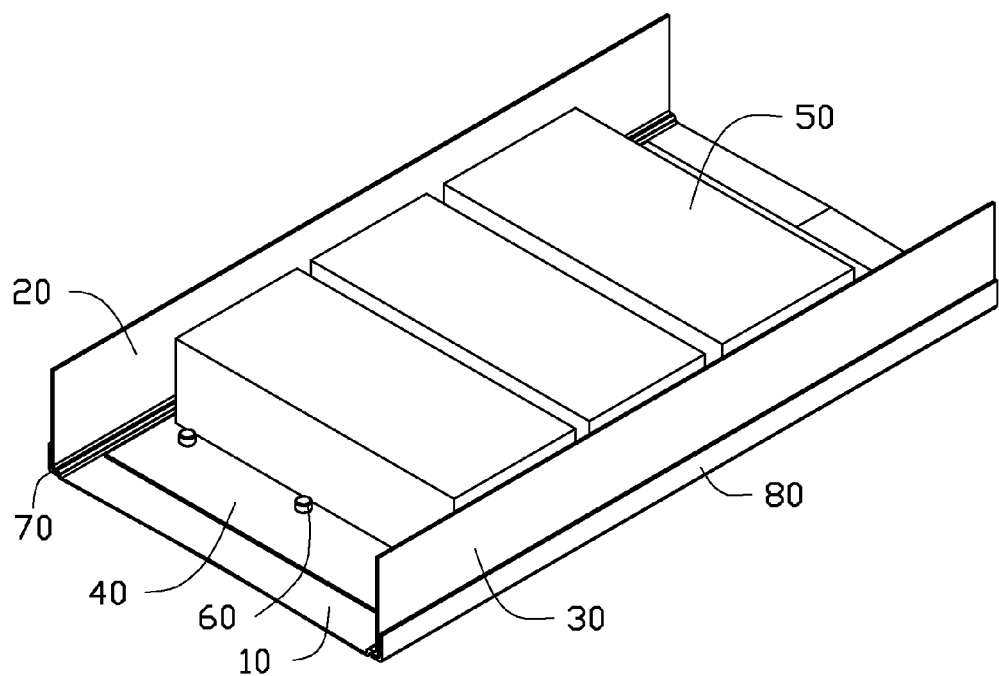
FIG. 2 is an assembled view of FIG. 1.
Figure 3:
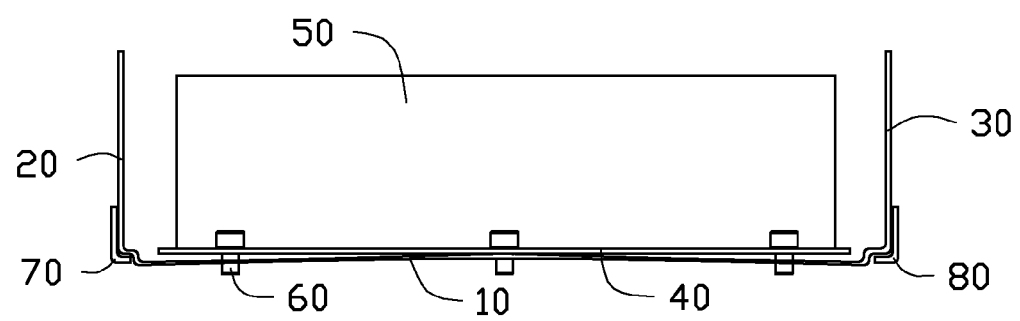
FIG. 3 is a front view of FIG. 2.

Referring to FIGS. 1-3, an electronic device enclosure, in accordance with an embodiment, includes a convex bottom plate 10, a first side plate 20 and a second side plate 30. The first side plate 20 and the second side plate 30 are located on the convex bottom plate 10 at opposite sides. In one embodiment, the electronic device enclosure may be a server chassis or a computer chassis.

A first electronic component 40, such as a motherboard, can be secured to the convex bottom plate 10. A plurality of second electronic components 50, such as a CPU, a connector, a heat dissipating component, can be secured to the first electronic component 40.

Referring to FIGS. 2-3, the convex bottom plate 10 is resiliently deformed down when the first electronic and second electronic components 40, 50 are secured to the convex bottom plate 10. Referring to FIG. 5, a horizontal plane 90 is defined connecting the bottom edges of the first and second side plates 20, 30. Supposing, the convex bottom plate 10 comprising a plurality of points, B (see FIG. 4) is random, and B includes a highest point A (see FIG. 4). In one embodiment, a distance between the highest point A and the horizontal plane 90 is in a range of 0.7 mm-1.4 mm. In one embodiment, a width of the convex bottom plate 10 is 480 mm, and the distance between the highest point A of the convex bottom plate 10 and the horizontal plane 90 is substantially equal to 0.76 mm.

In testing, the first and second electronic components 40, 50 are mounted to the convex bottom plate 10 with a plurality of fixing members 60. The electronic device enclosure is located between a first sliding rail 70 and a second sliding rail 80. Therefore, the convex bottom plate 10 can be located between a first position and a second position (see FIG. 4). In the first position, a first distance is defined between the plurality of points B of the convex bottom plate 10 and the horizontal plane 90. In the second position, a second distance is defined between the plurality of points B of the convex bottom plate 10 and the horizontal plane 90, the second distance is less than the first distance. For example, the second distance of the second position (S2) is obtained according to a formula S2=V−S1, wherein the V is a movable distance that the convex bottom plate 10 is moved relative to the first position, and S1 is the first distance.

Figure 4:
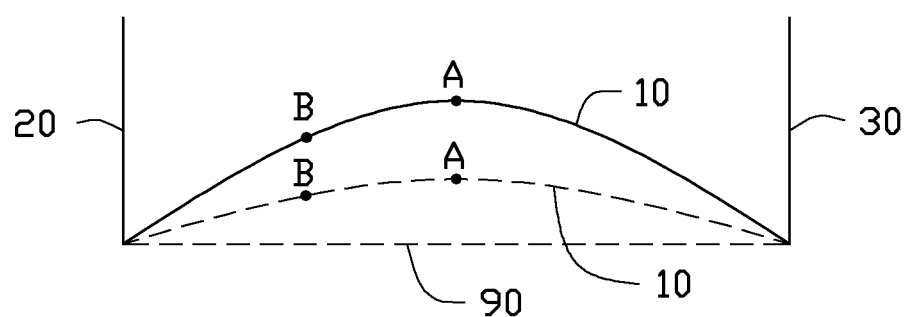
FIG. 4 illustrates a convex bottom plate of the electronic device enclosure in different states.
Figure 5:
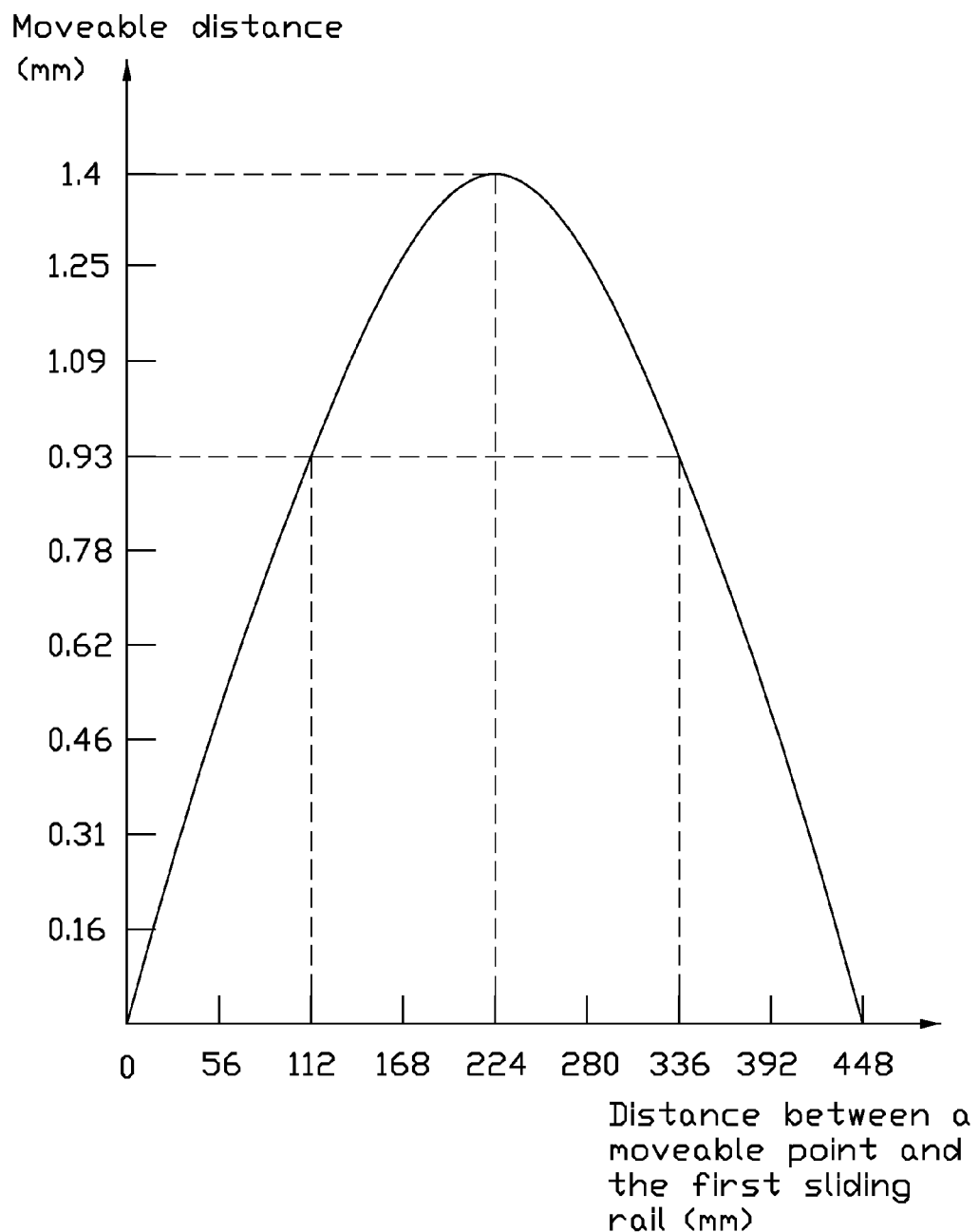
FIG. 5 is a graph illustrating a moveable distance of a plurality of points of the convex bottom plate moved from the first position to the second position when the convex bottom plate endures the first and second components.

Referring to FIGS. 4-5, a software AnSys is used for simulating the principal stress applied on an embodiment of the convex bottom plate 10 when the convex bottom plate 10 suffers an impact from the first and second electronic components 40, 50. Generally, the first and second sliding rails 70, 80 support the convex bottom plate 10, so a portion, that is away from the first and second sliding rails 70, 80, will suffer maximum stress.

Referring also to FIG. 5, FIG. 5 shows a moveable distance of the plurality of points B of the convex bottom plate 10 moved from the first position to the second position in different areas of the convex bottom plate 10 when pressed by the first and second electronic components 40, 50. Clearly, the moveable distance is a parabola, and the moveable distance of the plurality of points B is different. For example, when a third distance between the plurality of points B and the first sliding rail 70 is increased to 224 mm from 0 mm, the moveable distance of the plurality of points B is increased to 1.4 mm from 0 mm. When the third distance between the plurality of points B and the first sliding rail 70 is increased to 448 mm from 224 mm, the moveable distance of the plurality of points B is decreased to 0 mm from 1.4 mm. When one of the plurality of points B is the highest point A, and the third distance between the one of the plurality of points B and the first sliding rail 70 is substantially equal to that between the one of the plurality of points B and the second sliding rail 80, the moveable distance of the one of the plurality of points B is greatest (1.4 mm).

When the one of the plurality of points B is the highest point A, the first distance (S1) in the first position between the highest point A of the convex bottom plate 10 and the horizontal plane 90 is 0.7-1.4 mm. Therefore, the second distance in the second position between the highest point A of the convex bottom plate 10 and the horizontal plane 90 is 0-0.7 mm, according to the formula S2=V−S1. For example, if the moveable distance (V) of the highest point A is the greatest (1.4 mm), and the first distance (S1) is the least (0.7 mm), the second distance (S2) is thereby 0.7 mm. If the moveable distance (V) of the highest point A is the greatest (1.4 mm), and the first distance (S1) is the greatest (1.4 mm), the second distance (S2) is thereby 0 mm. Therefore, after the convex bottom plate 10 is deformed, the second distance (S2) between the highest point A and the horizontal plane 90 is in a range 0-0.7 mm, for improving the structure of the convex bottom plate 10.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An electronic device enclosure comprising:
a convex bottom plate, the convex bottom plate comprising a bottom surface and a top surface opposite to the bottom surface, an electronic component attached to the top surface of the convex bottom plate; and
a first side plate connected to a first end of the convex bottom plate, and a second side plate connected to a second end of the convex bottom plate; and a horizontal plane is defined by connecting bottom edges of the first side plate and the second side plate, the bottom surface of the convex bottom plate deviates from the horizontal plane and a distance is defined between a highest point of the bottom surface of the convex bottom plate and the horizontal plane, wherein the distance is in a range of about 0.7 mm to about 1.4 mm.

2. The electronic device enclosure of claim 1, wherein the convex bottom plate is resiliently deformable between a first position and a second position, the distance between the highest point of the convex bottom plate and the horizontal plane of the second position is less than that of the first position.

3. The electronic device enclosure of claim 2, wherein the distance in the first position is 0.76 mm.

4. The electronic device enclosure of claim 2, wherein the distance between the highest point of the convex bottom plate and the horizontal plane of the second position is less than 0.7 mm.

5. The electronic device enclosure of claim 2, wherein a moveable distance between a point near to the first side plate and the highest point is different.

6. The electronic device enclosure of claim 5, wherein when the first side plate is located on a first sliding rail and the second side plate is located on a second sliding rail the moveable distance, from a first point of the plurality of points near to the first sliding rail to the highest point, is increased; and, the moveable distance from the highest point to a second point of the plurality of points near to the second sliding rail to the highest point, is decreased.

7. The electronic device enclosure of claim 1, wherein the electronic device enclosure is a server chassis.

8. An electronic device enclosure comprising:
a convex bottom plate, an electronic component attached to the convex bottom plate; and
a first side plate connected to a first end of the convex bottom plate, and a second side plate connected to a second end of the convex bottom plate, and a horizontal plane is defined by connecting bottom edges of the first side plate and the second side plate;
wherein the convex bottom plate is resiliently deformable between a first position and a second position, a first distance is defined between a plurality of points of the convex bottom plate and the horizontal plane when the convex bottom plate is located in the first position, a second distance is defined between the plurality of points when the convex bottom plate is located in the second position, and the second distance is less than 0.7 mm.

9. The electronic device enclosure of claim 8, wherein when one of the plurality of points is a highest point of the convex bottom plate, the first distance is in a range of about 0.7 mm to about 1.4 mm.

10. The electronic device enclosure of claim 9, wherein the first distance is 0.76 mm, when the one of the plurality of points is the highest point.

11. The electronic device enclosure of claim 8, wherein the second distance is less than the first distance.

12. The electronic device enclosure of claim 8, wherein a moveable distance between a point near to the first side plate and the highest point is different.

13. The electronic device enclosure of claim 12, wherein when the first side plate is located on a first sliding rail and the second side plate is located on the second sliding rail, the moveable distance, from a first point of the plurality of points near to the first sliding rail to the highest point, is increased; and, the moveable distance from the highest point to a second point of the plurality of points near to the second sliding rail to the highest point, is decreased.

14. The electronic device enclosure of claim 8, wherein the electronic device enclosure is a server chassis.

* * * * *